United States Patent
Tan

(10) Patent No.: US 9,054,088 B2
(45) Date of Patent: Jun. 9, 2015

(54) MULTI-COMPONENT CHIP PACKAGING STRUCTURE

(71) Applicant: Silergy Semiconductor Technology (Hangzhou) LTD, Hangzhou, ZheJiang Province (CH)

(72) Inventor: Xiaochun Tan, Hangzhou (CH)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 14/077,425

(22) Filed: Nov. 12, 2013

(65) Prior Publication Data

US 2014/0159219 A1 Jun. 12, 2014

(30) Foreign Application Priority Data

Dec. 11, 2012 (CN) .......................... 2012 1 0538747

(51) Int. Cl.
| | |
|---|---|
| H01L 23/498 | (2006.01) |
| H01L 23/495 | (2006.01) |
| H01L 23/64 | (2006.01) |
| H01L 25/16 | (2006.01) |
| H01L 23/00 | (2006.01) |

(52) U.S. Cl.
CPC ..... *H01L 23/495* (2013.01); *H01L 2224/73253* (2013.01); *H01L 2224/48091* (2013.01); *H01L 2224/73265* (2013.01); *H01L 23/645* (2013.01); *H01L 24/13* (2013.01); *H01L 24/16* (2013.01); *H01L 24/29* (2013.01); *H01L 24/32* (2013.01); *H01L 24/73* (2013.01); *H01L 2224/131* (2013.01); *H01L 2224/16225* (2013.01); *H01L 2224/16245* (2013.01); *H01L 2224/2919* (2013.01); *H01L 2224/32245* (2013.01); *H01L 2924/19042* (2013.01); *H01L 2924/19104* (2013.01); *H01L 2924/19107* (2013.01); *H01L 2924/30107* (2013.01); *H01L 25/16* (2013.01); *H01L 2224/32145* (2013.01); *H01L 2224/32225* (2013.01); *H01L 2224/48227* (2013.01)

(58) Field of Classification Search
CPC .............................. H01L 23/495; H01L 23/645
USPC .................................................. 257/676, 735
See application file for complete search history.

(56) References Cited

U.S. PATENT DOCUMENTS

| | | | |
|---|---|---|---|
| 2004/0213042 A1* | 10/2004 | Johnson ......................... | 365/158 |
| 2009/0039869 A1* | 2/2009 | Williams ................... | 324/123 R |
| 2010/0171145 A1* | 7/2010 | Morgan et al. .................. | 257/99 |
| 2010/0246144 A1* | 9/2010 | Yamazaki et al. ............. | 361/749 |
| 2012/0171814 A1* | 7/2012 | Choi et al. ..................... | 438/107 |
| 2013/0299957 A1* | 11/2013 | Kobayashi et al. ........... | 257/676 |
| 2014/0103544 A1* | 4/2014 | Yokoyama et al. ........... | 257/777 |

FOREIGN PATENT DOCUMENTS

WO WO 2012107972 * 8/2012 .................... 257/676

* cited by examiner

*Primary Examiner* — Walter H Swanson
(74) *Attorney, Agent, or Firm* — Michael C. Stephens, Jr.

(57) ABSTRACT

Disclosed herein are various chip packaging structures and arrangements. In one embodiment, a multiple-component chip packaging structure can include: (i) a first component arranged on a bottom layer; (ii) at least one second component arranged on the first component, where the at least one second component is electrically connected to the first component by a plurality of protruding structures; (iii) at least one third component on the at least one second component; (iv) at least one extension structure arranged on at least one side of the at least one third component, where the at least one extension structure is configured to lead out electric polarities of the at least one third component; and (v) a plurality of bonding wires that electrically connect the at least one extension structure to the first component.

11 Claims, 6 Drawing Sheets

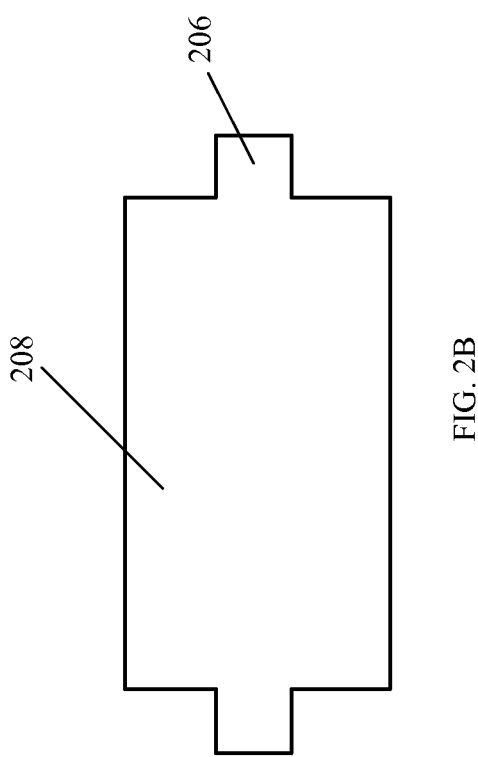

MULTI-COMPONENT CHIP PACKAGING STRUCTURE

RELATED APPLICATIONS

This application claims the benefit of Chinese Patent Application No. 201210538747.3, filed on Dec. 11, 2012, which is incorporated herein by reference in its entirety.

FIELD OF THE INVENTION

The present invention relates to the field of semiconductor packaging, and more particularly to a multi-component chip packaging structure.

BACKGROUND

With the increasing demands for miniaturization, as well as light-weight and multiple-functional electronic components, semiconductor packaging structure requirements for reduced package volume are increasing. In particular, multi-chip packaging structures are becoming increasingly important. However, in such multi-chip semiconductor packaging structures, connections between the chips may have a crucial impact on package size and device performance.

SUMMARY

In one embodiment, a multiple-component chip packaging structure can include: (i) a first component arranged on a bottom layer; (ii) at least one second component arranged on the first component, where the at least one the second component is electrically connected to the first component by a plurality of protruding structures; (iii) at least one third component on the at least one second component; (iv) at least one extension structure arranged on at least one side of the at least one third component, where the at least one extension structure is configured to lead out electric polarities of the at least one third component; and (v) a plurality of bonding wires that electrically connect the at least one extension structure to the first component.

Embodiments of the present invention can provide several advantages over conventional approaches, as may become readily apparent from the detailed description of preferred embodiments below.

BRIEF DESCRIPTION OF THE DRAWINGS

FIG. 2B is a top view diagram of example third components arranged on the upper layer in the chip packaging structure of FIG. 2A.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
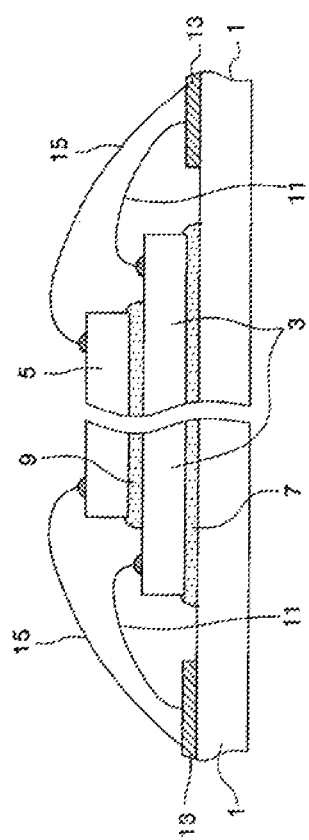
FIG. 1 is a cross-section diagram of an example multi-chip packaging structure.

Referring now to FIG. 1, shown a cross-section view of an example multi-chip packaging structure. In this example, bottom layer chip 3 and upper layer chip 5 can be stacked on printed-circuit board (PCB) 1. A surface of bottom layer chip 3 can connect to the upper surface of PCB 1 through adhesive 7. Also, a surface of upper layer chip 5 can connect to the other surface of bottom layer chip 3 through adhesive 9. In order to expose the pads (for bonding wires) along the top edge of bottom layer chip 3, a width of upper layer chip 5 should be less than a width of bottom layer chip 3.

Solder or metal pads on bottom layer chip 3 and upper layer chip 5 can be electrically connected (e.g., at pads 13) to PCB 1 through bonding wires 11 and bonding wires 15, respectively. Therefore, a height of bonding wires 15 can be greater than that of upper layer chip 5. Because of this arrangement, a thickness of the plastic shell for packaging bonding wires 11, bonding wires 15, upper layer chip 5, and bottom layer chip 3 can be relatively large. Further, due to interference that may be caused by caused by the inductance and/or resistance of the bonding wires, the high frequency performance of the chips may be limited by this type of package structure.

In one embodiment, a multiple-component chip packaging structure can include: (i) a first component arranged on a bottom layer; (ii) at least one second component arranged on the first component, where the at least one the second component is electrically connected to the first component by a plurality of protruding structures; (iii) at least one third component on the at least one second component; (iv) at least one extension structure arranged on at least one side of the at least one third component, where the at least one extension structure is configured to lead out electric polarities of the at least one third component; and (v) a plurality of bonding wires that electrically connect the at least one extension structure to the first component.

Figure 2A:
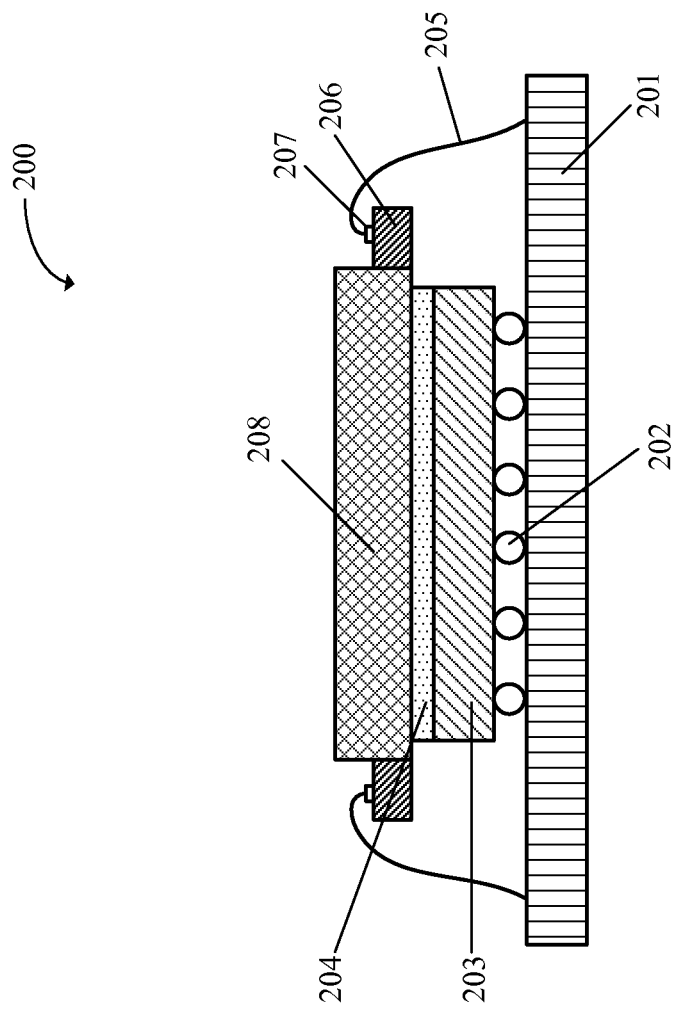
FIG. 2A is a cross-section diagram of a first example multi-component chip packing structure in accordance with embodiments of the present invention.

Referring now to FIG. 2A, shown is a cross-section view of a first example multi-component chip packing structure in accordance with embodiments of the present invention. In this particular example, the multi-component chip packaging structure 200 can include printed-circuit board (PCB) 201 located on the bottom layer, and chip 203 located on PCB 201. Chip 203 can be electrically connected to PCB 201 through solder balls 202. Chip packaging structure 200 can also include inductor 208 located above chip 203. Further, extension structures 206 can be arranged on two opposite sides of inductor 208. Also, solder pads 207 may be located on extension structures 206, and can be connected to PCB 201 through boding wires 205.

For example, PCB 201 may be referred to as a first component, chip 203 may be referred to as a second component, inductor 208 can be referred to as a third component, and solder balls 202 can be referred to as protruding structures.

Further, as described herein, "above," "on," "bent," "stack," and other terms describing the assemblies or connections therebetween may indicate relative arrangements without limiting the orientation of the overall package structure.

Referring now to FIG. 2B, shown is a top view of a third component (e.g., an inductor) arranged on the upper layer in the chip packaging structure of FIG. 2A. In this particular example, two extension structures 206 can be located on opposite sides of inductor 208 for leading out, or making available for connection, two polarities of inductor 208 through extension structures 206. For example, the "polarities" of the inductor can include the input terminal and the output terminal of inductor 208. In other cases, polarities can indicate other connections (e.g., power supply, ground, output node, etc.) for other types of circuits (e.g., switching regulator, light-emitting diode [LED] driver, etc.).

Packaging structure 200 can also include adhesive layer 204 between chip 203 and inductor 208. Adhesive layer 204 may facilitate electrical isolation between chip 203 and inductor 208, avoidance or reduction of interference between chip 203 and inductor 208, and increase stability of the system structure along with chip packaging structure 200. Adhesive layer 204 can also facilitate fixing positions of chip 203 and/or inductor 208 during the packaging process. Adhesive layer 204 can include any non-conductive material, such as a non-conductive film, epoxy, or the like.

In this particular example, a thickness of extension structures 206 can be less than that of inductor 208. In other cases, the thickness of extension structures 206 can be the same as or greater than that of inductor 208. As such, extension structures can be in any suitable thickness. When the extension structures 206 are thinner than inductor 206, mounting space for bonding wires 205 at solder or metal pads 207 can be reserved. In other cases, when the thickness of extension structures 206 is equal to or greater than the thickness of the third components (e.g., inductor 208), the height of bonding wires 205 may increase the overall package height.

In particular embodiments, extension structures 206 may have a thickness less than that of inductor 208 in order to accommodate the attachment and bending of bonding wires 205 such that the package height may not be limited by bonding wire characteristics. In this way, the thickness and overall size of the chip packaging structure can be reduced as compared to other approaches.

Extension structures 206 can be formed in any suitable way. In one example, extension structures 206 can be formed together with inductor 208. That is, extension structure 206 can be a part of inductor 208, such as extensions (e.g., metal portions) of the inductor itself to form electrical connections to the terminals of inductor 208. In another example, inductor 208 can initially formed, and then extension structures 206 can be connected to the inductor 208, such as by soldering.

Those skilled in the art will recognize that while only one each of second and third components are shown in the particular example of FIG. 2A, any number of second components (e.g., chip 203) located above the first component (e.g., PCB 201), such as two, three, four, etc., can also be accommodated in particular embodiments. In such cases, multiple second components can be spaced apart or separated from each other without mutual contact. All of such second components can also be arranged above the first component. The third components can cover at least a portion of, and in some cases all of, the second components, and can be located above the second components.

In addition, the first component (e.g., 201) arranged on the bottom layer can alternatively include a lead frame with a plurality of pins. In this case, the second components (e.g., 203) can be electrically connected to corresponding pins of the lead frame through solder balls or bumps. Also, the third components (e.g., 208) located on the upper layer can be electrically connected to pins of the lead frame through bonding wires. In this way, the pins having corresponding electrical polarity (e.g., types of pins) or connection terminals can be appropriately connected across multiple devices.

The multi-component chip packaging structure of FIG. 2A may have a reduced size and relatively good mechanical and electrical stability, as compared to other approaches. In particular embodiments, the relatively large volume of magnetic components (e.g., inductor 208) can be accommodated along with associated chips in a single packaging structure. In this way, an inductor with a relatively large volume can be integrated with other chips and/or devices in a highly integrated system with a relatively small volume or package size.

Figure 3A:
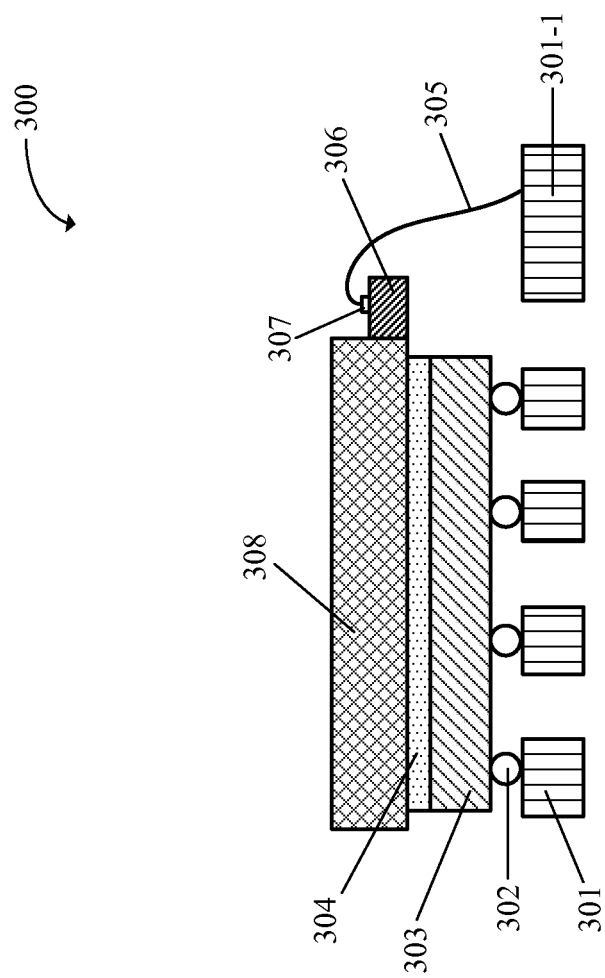
FIG. 3A is a cross-section diagram of a second example multi-component chip packing structure in accordance with second embodiment of the present invention.

Referring now to FIG. 3A, shown is a cross-section view of a second example multi-component chip packing structure in accordance with embodiments of the present invention. In this particular example, multi-component packaging structure 300 can include lead frame 301 with a plurality of pins located on the bottom layer. Chip 303 can be located above lead frame 301, and chip 303 may be electrically connected to lead frame 301 through solder balls 302. Also, inductor 308 can be located above chip 303, and extension structures 306 may be arranged on one side of inductor 308.

Solder or metal pads 307 can be located on extension structures 306, and can be connected to corresponding pins 301-1 of lead frame 301 through boding wires 305. Also in this example, extension structures 306 may have a thickness that is less than that of inductor 308. Also, extension structures 308 may be arranged only on one side, such as the right side as shown, of inductor 308. In this example, lead frame 301 may be referred to as a first component, chip 303 may be referred to as a second component, inductor 308 can be referred to as a third component, and solder balls 202 can be referred to as protruding structures.

Figure 3B:
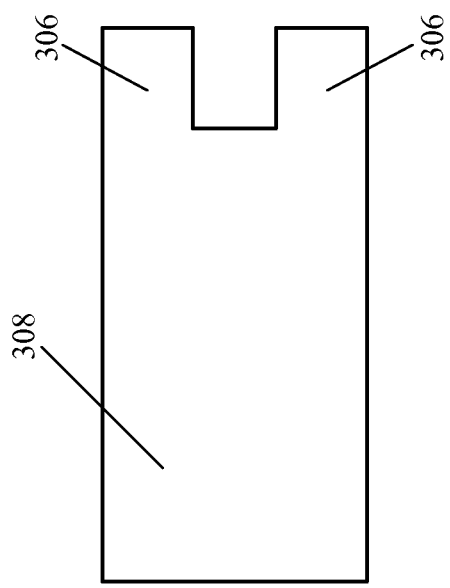
FIG. 3B is a top view of example third components arranged on the upper layer in the chip packaging structure of FIG. 3A.

Referring now to FIG. 3B, shown is a top view of inductor 308 and extension structures 306 on the upper layer in the chip packaging structure of FIG. 3A. Two extension structures 306 can be located on one side of inductor 308 for leading out two polarities of inductor 308 through extension structures 306. For example, the "polarities" of the inductor can include the input terminal and the output terminal of inductor 208/308.

Chip packaging structure 300 can also include adhesive layer 304 between chip 303 and inductor 308. Adhesive layer 304 can help to realize electrical isolation between chip 303 and inductor 308, and to substantially avoid or minimize interference between chip 303 and inductor 308. Adhesive layer 304 may also aid in fixing positions of chip 303 and/or inductor 308 during package assembly, and to increase the stability of the overall system and chip packaging structure 300.

In addition, in this particular example, a polarity of inductor 308 can be connected to pins 301-1 of the lead frame through extension structures 306, and a polarity of chip 303 can be connected to pins 301-1 through solder balls 302. In this way, appropriate polarities of the inductor can be electrically connected to corresponding polarities of the chip inside the packaging structure. This approach can reduce the number of pins, may avoid interference, reduce power losses, etc., as compared to having connections formed outside of the package structure.

Figure 4:
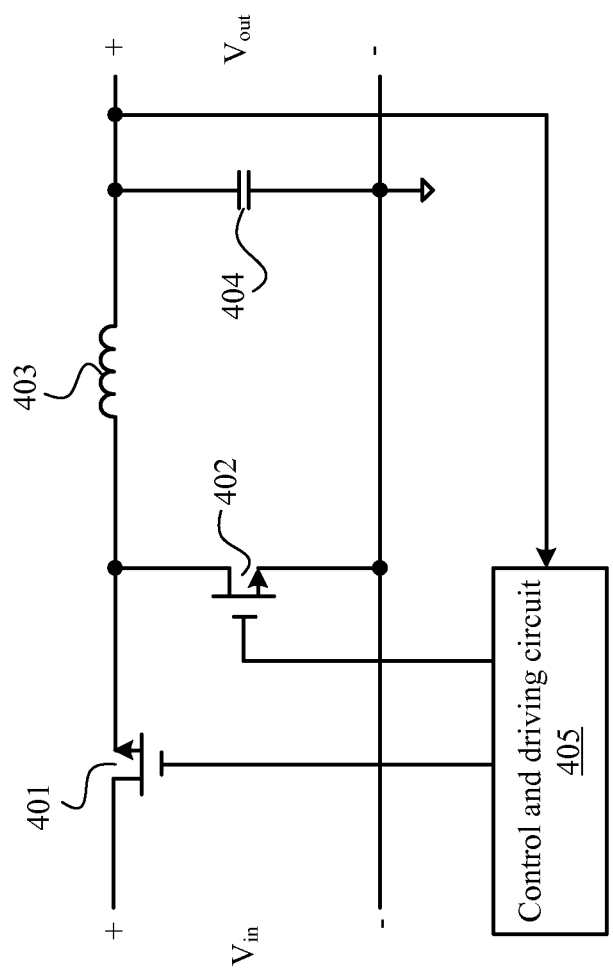
FIG. 4 is a schematic diagram of an example synchronous switching voltage regulator.

Referring now to FIG. 4, shown is a schematic diagram of an example switching voltage regulator. A switching voltage regulator is just one example of the circuitry that can be included in packaging structures 200 and/or 300. In this example, power transistor 401, power transistor 402, inductor 403, and capacitor 404 can form a synchronous buck power stage circuit. In other cases, other types of power stage or converter circuits (e.g., flyback, SEPIC, boost, buck-boost, etc.) can be formed. Control and driving circuit 405 (e.g., including a pulse-width modulation [PWM] controller) can receive an output signal of the power stage circuit, to form a closed-loop feedback control loop to control the switching state of power transistors 401 and 402. In this way, the output signal of the power stage circuit can be controlled to be substantially constant.

The packaging structure 200 and/or 300 can be employed for this type of power circuitry. For example, power transistors 401 and 402 can be integrated into a single chip, and control and driving circuit 405 can be integrated into another chip, and then the two chips can be encapsulated essentially in parallel in the packaging structure. In one example, power transistors 401 and 402 can be integrated in chip 203, control and driving circuit 405 and inductor 403 can be integrated in chip 208. In another example, power transistors 401 and 402, and controlling driving circuit 405 can be integrated in chip 303, and inductor 403 can be integrated in 308.

Of course, other integration or grouping of circuitry into different chips or ICs can be accommodated in particular embodiments. In one example, a multi-chip packaging structure in particular embodiments can include power transistor 401 and power transistor 402 being integrated into a power device chip (e.g., 203), and control and driving circuit 405 being integrated into a control chip (e.g., 208). The power device chip can be placed directly on the PCB or lead frame, such that the area of the power device chip can be as close to the area of the chip carrier as possible. Since the power device may process a high voltage and/or a high current, the power device chip with a large area can be able to withstand a relatively high voltage and a relatively high current. Also, the power device may have better thermal characteristics for power supply integration.

For the integrated circuit of the switching voltage regulator shown in FIG. 4, if the carrying capacity of power transistor 402 is greater than that of power transistor 401, power transistor 402 may be much larger than power transistor 401. Thus, power transistor 402 (e.g., the synchronous power device) can be integrated in a single synchronous power device chip, and power transistor 401 (e.g., the main power device) as well as control and driving circuit 405 can be integrated in another single mixed chip. The synchronous power device chip (e.g., 203) can be placed on lead frame or PCB 201. Adhesive layer 204 can be located above the synchronous power device chip, and the mixed chip can be third component 208.

In particular embodiments, a size of the chip packaging structure can be significantly reduced, and the structure may have relatively good mechanical and electrical stability, as compared to other approaches. In addition, the relatively large volume of magnetic components (e.g., inductor 308) can be accommodated along with associated chips in a single packaging structure. In this way, an inductor with a relatively large volume and/or capacitance can be integrated with other chips and/or devices in a highly integrated system with a relatively small volume or package size.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A multiple-component chip packaging structure, comprising:
    a) a first component;
    b) at least one second component arranged on said first component, wherein said at least one second component is electrically connected to said first component by a plurality of protruding structures, wherein said at least one second component comprises at least one power transistor;
    c) an inductor on said at least one second component, wherein said inductor is coupled to said at least one power transistor in a configuration of a switching voltage regulator;
    d) at least one extension structure arranged on at least one side of said inductor, wherein said at least one extension structure leads out electrical polarities of said inductor, and wherein said inductor and said at least one extension structure are in an upper layer of said chip packaging structure; and
    e) a plurality of bonding wires, wherein each bonding wire electrically connects one of said at least one extension structure to said first component.

2. The chip packaging structure of claim 1, wherein said at least one extension structure comprises a thickness that is less than a thickness of said inductor to accommodate attachment and bending of said plurality of bonding wires without increasing a height of said chip packaging structure.

3. The chip packaging structure of claim 1, wherein said first component comprises a printed-circuit board (PCB).

4. The chip packaging structure of claim 1, wherein said first component comprises a lead frame.

5. The chip packaging structure of claim 1, wherein said at least one second component comprises a chip.

6. The chip packaging structure of claim 1, wherein said inductor comprises a width greater than a width of said at least one second component.

7. The chip packaging structure of claim 1, wherein said switching voltage regulator is configured for a light-emitting diode (LED) driver.

8. The chip packaging structure of claim 1, further comprising an adhesive layer arranged between said at least one second component and said inductor.

9. The chip packaging structure of claim 1, wherein said plurality of protruding structures comprises bumps.

10. The chip packaging structure of claim 1, wherein said plurality of protruding structures comprises solder balls.

11. The chip packaging structure of claim 1, wherein said inductor comprises polarities that are electrically connected to corresponding polarities of said first component by said plurality of bonding wires.

* * * * *